United States Patent
Kobolla et al.

(10) Patent No.: US 10,270,358 B2
(45) Date of Patent: Apr. 23, 2019

(54) POWER ELECTRONICS SUBMODULE HAVING DC AND AC VOLTAGE TERMINAL ELEMENTS, AND ASSEMBLY HEREOF

(71) Applicant: SEMIKRON ELEKTRONIK GMBH & CO. KG, Nuremberg (DE)

(72) Inventors: Harald Kobolla, Seukendorf (DE); Alexander Wehner, Nuremberg (DE); Ingo Bogen, Nuremberg (DE); Jürgen Steger, Hiltpoltstein (DE); Peter Beckedahl, Oberasbach (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 0 days.

(21) Appl. No.: 16/019,644

(22) Filed: Jun. 27, 2018

(65) Prior Publication Data
US 2019/0020285 A1  Jan. 17, 2019

(30) Foreign Application Priority Data
Jul. 14, 2017  (DE) .......................... 10 2017 115 883

(51) Int. Cl.
*H02M 7/00* (2006.01)
*H05K 1/02* (2006.01)
(Continued)

(52) U.S. Cl.
CPC .......... *H02M 7/003* (2013.01); *H05K 1/0213* (2013.01); *H05K 1/11* (2013.01);
(Continued)

(58) Field of Classification Search
CPC ..... H02M 7/003; H05K 1/0213; H05K 7/209; H05K 1/11; H05K 1/181; H05K 2201/015;
(Continued)

(56) References Cited

U.S. PATENT DOCUMENTS 9,627,343 B2 * 4/2017 Kroneder ............ H01L 23/4006
9,653,862 B2 * 5/2017 Bittner ................. H01R 13/621
(Continued)

FOREIGN PATENT DOCUMENTS

DE  10 2015 114 188  3/1917

*Primary Examiner* — Anthony M Haughton
*Assistant Examiner* — Yahya Ahmad
(74) *Attorney, Agent, or Firm* — Lackenbach Siegel, LLP; Andrew F. Young

(57) ABSTRACT

A submodule and an assembly include a switching device having a substrate, and printed conductors arranged thereupon. The submodule incorporates a first and a second DC voltage printed conductor, to which a first and a second DC voltage terminal element are connected in an electrically conductive manner, and an AC voltage printed conductor, to which an AC voltage terminal element is connected in an electrically conductive manner. The submodule further comprises an insulating moulding, which encloses the switching device in a frame-type arrangement. The first DC voltage terminal element, by means of a first contact section, engages with a first supporting body of the insulating moulding, and the AC voltage terminal element, by means of a second contact section, engages with a second supporting body of the insulating moulding. To this end, a first clamping device is configured to project through a first recess in the first supporting body, in an electrically insulating manner, and to form an electrically-conductive clamping connection between the first DC voltage terminal element and an associated first DC voltage connecting element, and a second clamping device is configured to project through a second recess in the second supporting body, in an electrically insulating manner, and to form an electrically-conductive clamping connection between the AC voltage terminal element and an associated AC voltage connecting element.

16 Claims, 4 Drawing Sheets

(51) Int. Cl.
   *H05K 1/18*   (2006.01)
   *H05K 1/11*   (2006.01)
   *H05K 7/20*   (2006.01)

(52) U.S. Cl.
   CPC ............ *H05K 1/181* (2013.01); *H05K 7/209* (2013.01); *H05K 2201/015* (2013.01); *H05K 2201/0141* (2013.01); *H05K 2201/0154* (2013.01); *H05K 2201/10053* (2013.01); *H05K 2201/10409* (2013.01)

(58) Field of Classification Search
   CPC ... H05K 2201/0154; H05K 2201/0141; H05K 2201/10409; H05K 2201/10053
   See application file for complete search history.

(56) References Cited

U.S. PATENT DOCUMENTS

| | | | |
|---|---|---|---|
| 9,735,524 B1* | 8/2017 | Rabl | H01R 4/30 |
| 9,768,094 B2* | 9/2017 | Walter | H01L 23/3675 |
| 9,883,596 B2* | 1/2018 | Gobl | H01L 25/07 |
| 9,935,032 B2* | 4/2018 | Frank | H01L 23/32 |
| 9,980,414 B2* | 5/2018 | Hebert | H05K 7/20909 |
| 10,002,812 B2* | 6/2018 | Gobl | H05K 7/209 |
| 10,079,120 B2* | 9/2018 | Kobolla | H01H 1/20 |
| 10,079,197 B2* | 9/2018 | Schleicher | H01L 23/06 |
| 10,090,774 B1* | 10/2018 | Beckedahl | H02M 7/003 |
| 10,141,247 B2* | 11/2018 | Walter | H01L 23/49562 |
| 10,157,806 B2* | 12/2018 | Bogen | H01L 23/043 |
| 10,163,761 B2* | 12/2018 | Bogen | H05K 7/1432 |
| 10,164,026 B2* | 12/2018 | Kobolla | H01L 23/498 |

* cited by examiner

POWER ELECTRONICS SUBMODULE HAVING DC AND AC VOLTAGE TERMINAL ELEMENTS, AND ASSEMBLY HEREOF

CROSS REFERENCE TO RELATED APPLICATION

This application relates to, and claims priority from, Ser. No.: DE 10 2017 115 883.9 filed Jul. 14, 2017, the entire contents of which are incorporated herein by reference.

FIGURE SELECTED FOR PUBLICATION

FIG. 6

BACKGROUND OF THE INVENTION

Field of the Invention

The present invention relates to a power electronics submodule having a switching device.

More specifically, the invention describes a power electronics submodule having a switching device. A substrate of the switching device incorporates a first and a second DC voltage printed conductor, to which a first and a second DC voltage terminal element are connected, with the correct polarity, in an electrically conductive manner. The substrate further incorporates an AC voltage printed conductor, to which an AC voltage terminal element is connected, with the correct polarity, in an electrically conductive manner. The switching device further incorporates a housing, which can also be configured as a sub-housing. The function of the DC voltage terminal elements is preferably the provision of a connection to a capacitor device, which is configured in the form of intermediate circuit capacitors for the current converter module. The function of the AC voltage terminal element is preferably the provision of a connection to a motor, or to an electrical machine in general. The invention further describes an assembly having a submodule of this type, or a plurality thereof, and having a support device for the latter, which can specifically be configured as a cooling device.

Description of the Related Art

From the prior art, DE 10 2015 114 188 A1 discloses a submodule, which is configured with a substrate, with a power semiconductor element, with a connecting device, with a terminal device and with an insulating body. The substrate incorporates mutually electrically-insulated printed conductors, wherein the power semiconductor element is arranged on one printed conductor, and is connected thereto in an electrically conductive manner. The connecting device is configured as a composite foil structure, and thus constitutes a first main surface, which faces the power semiconductor element and the substrate, and a second main surface arranged in opposition to the first, wherein the submodule is internally connected in-circuit by means of the connecting device. The insulating body comprises a first sub-body, which is bonded to one edge of the substrate, and further incorporates a first recess for the terminal element. The insulating body also comprises a second sub-body, which is configured as a pressure component, and incorporates a second recess, in which a pressure element is arranged in a projecting manner. The first sub-body is connected to the second sub-body, such that said second sub-body is arranged to move in relation to the first sub-body in the direction of the substrate, such that the pressure element compresses a section of the second main surface of the composite foil structure, wherein this section is arranged to project in the perpendicular direction of the power semiconductor element, within the surface of said power semiconductor element.

ASPECTS AND SUMMARY OF THE INVENTION

According to one aspect of the present invention, there is provided a submodule and an assembly including a switching device having a substrate, and printed conductors arranged thereupon. The submodule incorporates a first and a second DC voltage printed conductor, to which a first and a second DC voltage terminal element are connected in an electrically conductive manner, and an AC voltage printed conductor, to which an AC voltage terminal element is connected in an electrically conductive manner. The submodule further comprises an insulating moulding, which encloses the switching device in a frame-type arrangement. The first DC voltage terminal element, by means of a first contact section, engages with a first supporting body of the insulating moulding, and the AC voltage terminal element, by means of a second contact section, engages with a second supporting body of the insulating moulding. To this end, a first clamping device is configured to project through a first recess in the first supporting body, in an electrically insulating manner, and to form an electrically-conductive clamping connection between the first DC voltage terminal element and an associated first DC voltage connecting element, and a second clamping device is configured to project through a second recess in the second supporting body, in an electrically insulating manner, and to form an electrically-conductive clamping connection between the AC voltage terminal element and an associated AC voltage connecting element.

In consideration of the above-mentioned prior art, the object of the invention is the disclosure of a power electronics submodule having a power converter module, wherein the DC voltage terminal elements and the AC voltage terminal element are arranged and configured in a particularly advantageous manner. Specifically, this arrangement has an advantage, in that it relieves the tensile loading of the terminal elements.

According to the invention, this object is fulfilled by a power electronics submodule having the characteristics of the claims, and by an assembly according to the claims. Preferred forms of embodiment are described in the respective dependent claims.

The power electronics submodule according to the invention incorporates a switching device having a substrate, and printed conductors arranged thereupon. The submodule incorporates a first and a second DC voltage printed conductor, to which a first and a second DC voltage terminal element are connected, with the correct polarity, in an electrically conductive manner, and an AC voltage printed conductor, to which an AC voltage terminal element is connected, with the correct polarity, in an electrically conductive manner. The submodule further comprises an insulating moulding, which encloses the switching device in a frame-type arrangement. The first DC voltage terminal element, by means of a first contact section, engages with a first supporting body of the insulating moulding, and the AC voltage terminal element, by means of a second contact section, engages with a second supporting body of the insulating moulding. To this end, a first clamping device is configured to project through a first recess in the first supporting body, in an electrically insulating manner, and to form an electrically-conductive clamping connection between the first DC voltage terminal element and an associated first DC voltage connecting element, and a second clamping device is configured to project through a second recess in the second supporting body, in an electrically insulating manner, and to form an electrically-conductive clamping connection between the AC voltage terminal element and an associated AC voltage connecting element.

It is particularly advantageous if the first and the second DC voltage terminal elements, with an interposed insulating device, constitute a stacked arrangement, at least in one section.

The respective clamping device can be configured with a clamping element, preferably configured as a through-bolt and preferably having a spring device. The respective clamping device can also incorporate an insulating bush, through which the associated clamping element is routed.

Preferably, the housing is constituted from a material in the group of materials comprising high temperature-resistant plastics, specifically polyphenylene sulfide or polybutylene terephthalate.

It is preferred if both the DC voltage terminal elements and the AC voltage terminal element are constituted of a metal foil or sheet metal, preferably having a thickness between 300 µm and 2,040 µm, wherein a thickness between 500 µm and 1,500 µm is specifically preferred.

Preferably, the first recess in the first supporting body, the geometrical midpoint of the switching device, and the second recess in the second supporting body are arranged in a single line.

The assembly according to the invention comprises an above-mentioned power electronics submodule and a support device, which is specifically configured as a cooling device. To this end, the respective clamping device, specifically the respective bolt, is anchored in the support device, specifically by screwing and, simultaneously, by means of the first clamping device, an electrically-conductive clamping connection is formed between the first DC voltage terminal element and an associated first DC voltage connecting element, and likewise, by means of the second clamping device, an electrically-conductive clamping connection is formed between the AC voltage terminal element and an associated AC voltage connecting element. The respective clamping device simultaneously relieves the tensile loading applied to the respective connections.

It is specifically preferred if, simultaneously, by means of the first clamping device, an electrically-conductive clamping connection is formed between the second DC voltage terminal element and an associated second DC voltage connecting element.

It is further preferred if a pressure device is arranged above the switching device, which compresses the latter onto the support device, and wherein a pressure loading device is arranged above the pressure device, which is attached by means of the clamping devices, such that pressure is thus transmitted to the pressure device.

It can also be advantageous if a plurality of submodules, having a common overall housing, constitute a power module.

Naturally, unless explicitly excluded or excluded per se, characteristics described in the singular, specifically the switching device, or described in the context of the assembly of the submodule can also be present in the plural in the submodule according to the invention, or in said assembly.

It is understood that various configurations of the invention can be executed, either individually or in any desired combination, in the interests of achieving improvements. Specifically, the above-mentioned characteristics, and those identified and described hereinafter, regardless of whether they are described in the context of the submodule or the assembly thereof, can not only be employed in the combinations indicated, but also in other combinations or in isolation, without departing from the scope of the present invention.

Further clarifications of the invention, advantageous features and characteristics proceed from the following description of exemplary embodiments of the invention which are schematically represented in FIGS. 1 to 7, or from elements thereof.

The above and other aspects, objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
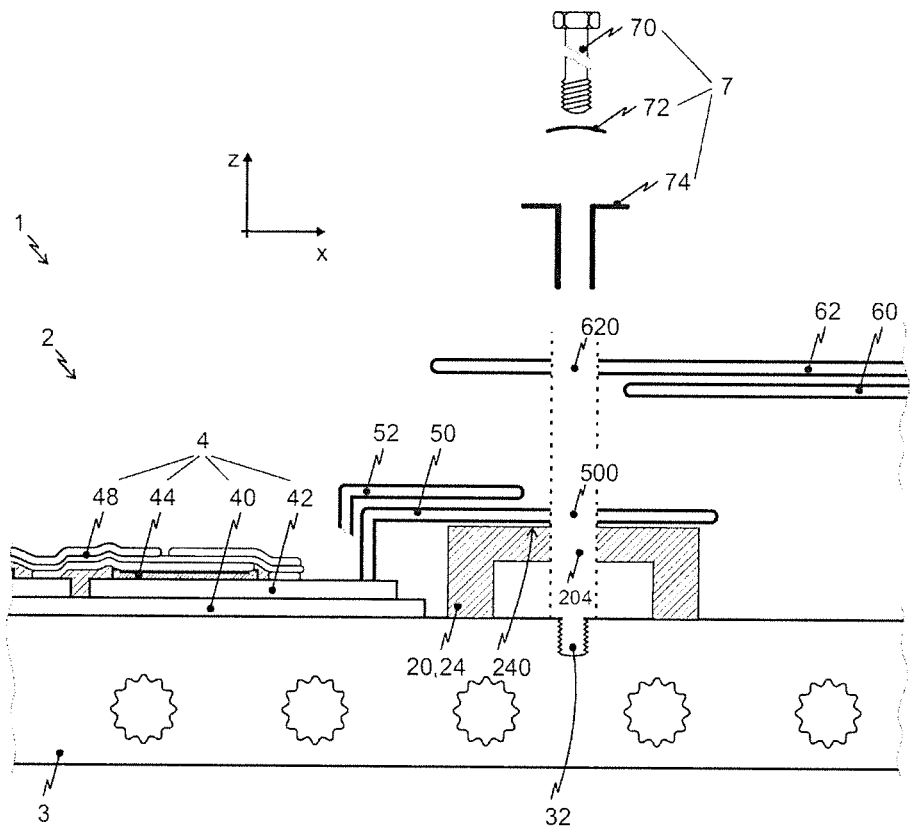
FIGS. 1 to 4 illustrate various elements of a first configuration of an assembly according to the invention, having a first configuration of the power electronics submodule according to the invention, represented in a lateral sectional view.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

In the present text, numerous specific details are set forth in order to provide a thorough understanding of exemplary versions of the present invention. It will be apparent, however, to one skilled in the art, that some versions of the present invention may possibly be practiced without some of these specific details. Indeed, reference in this specification to "an embodiment", "variants," and "one/the embodiment/variant," or "one version," "a version" and the like, should be understood to mean that a particular feature, structure, or characteristic described in connection with the variant or version is included in at least one such embodiment or variant or version according to the disclosure. Thus, the appearances of elements in one embodiment, version, or variant will be understood to be adaptively applicable to other embodiments, versions, or variants and that one embodiment does not necessarily refer to the same embodiment, version or variant. Nor are separate or alternative versions or variants mutually exclusive of other versions or variants. Moreover, various features may be described which possibly may be exhibited by some variants or versions and not by others.

Various operations may be described as multiple discrete operations in turn, in a manner that may be helpful in understanding embodiments of the present invention; however, the order of description should not be construed to imply that these operations are order dependent.

Figure 2:
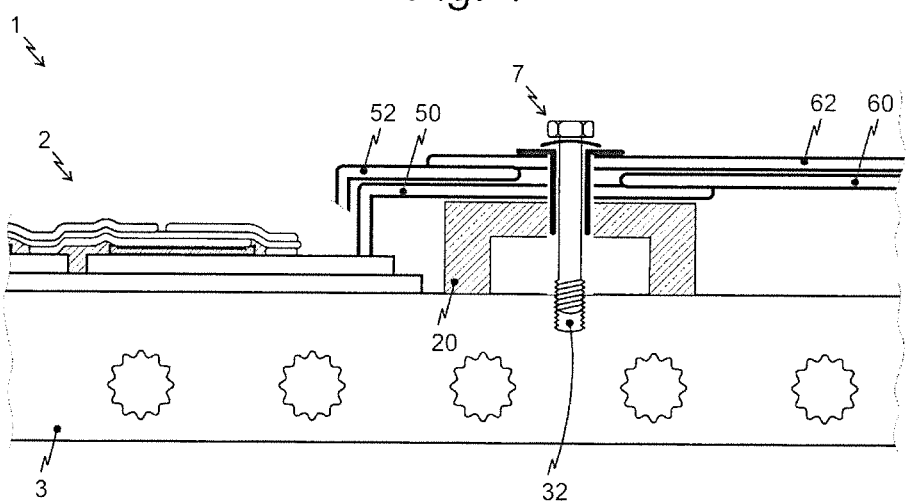

FIGS. 1 to 4 illustrate various elements of a first configuration of an assembly 1 according to the invention, having a first configuration of the power electronics submodule 2 according to the invention, represented in a lateral sectional view. FIGS. 1 and 2, and also FIGS. 3 and 4, respectively represent the same section in a partially exploded view, or in the assembled state. In each case, the power electronics submodule 2 is represented with a switching device 4 arranged on a support device 3, which is configured here as a cooling device, more specifically, and without loss of generality, as a fluid cooling device.

The switching device 4, for the purposes of electrical insulation with respect to the fluid cooling device 3 and thermal coupling with the fluid cooling device 3, incorporates an insulating body 40, which is configured as a ceramic body 40. This ceramic body 40, on the side thereof which is averted from the fluid cooling device 3, incorporates a plurality of printed conductors 42 which, during the operation of the switching device, are at different potentials. One of these printed conductors 42, one of a plurality of DC voltage printed conductors, assumes a DC voltage potential. The submodule 2, in combination with the switching device 4 constitutes, for example, a power converter circuit.

On at least one of these printed conductors 42 which, in combination with the insulating body 40, constitutes the substrate of the switching device 4, power semiconductor components 44 are arranged in a customary manner, and are connected in-circuit. In this embodiment, this connection is configured as a customary composite foil structure 48, comprised of alternately stacked electrically-conductive and electrically-insulating foils.

For external connection, this power converter module 2, as represented in FIGS. 1 and 2, incorporates two DC voltage terminal elements 50, 52, each of which is connected to one of the DC voltage potential-carrying DC voltage printed conductors 42 in an electrically conductive manner. This connection is customarily configured, in this case, without loss of generality, as a welded connection.

The function of these DC voltage terminal elements 50, 52 is the provision of a connection to the associated DC voltage connecting elements 60, 62, which are preferably connected to a capacitor device.

Figure 6:
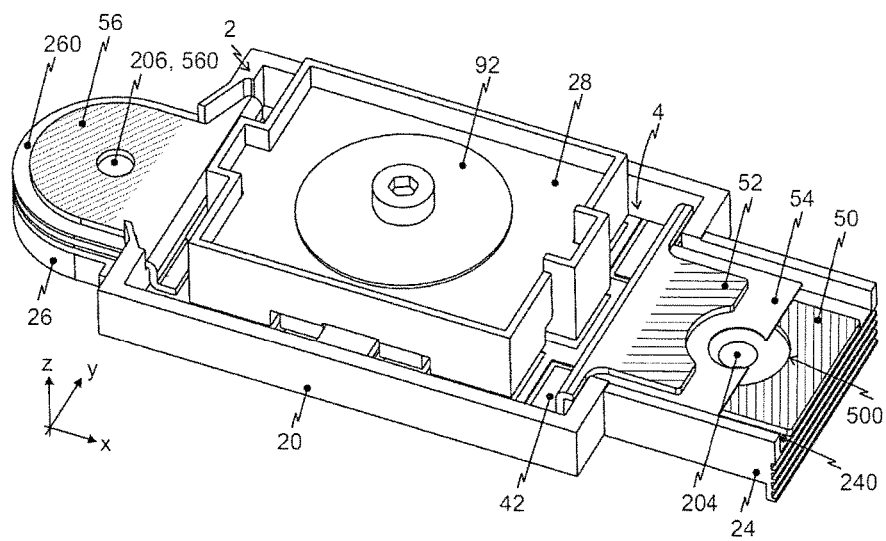
FIG. 6 shows a three-dimensional representation of a power electronics submodule.

In the region of the connection, configured by means of a first clamping device 7, between the DC voltage terminal elements 50, 52 and the DC voltage connecting elements 60, 62, the first DC voltage terminal element 50 and the second DC voltage terminal element 52 constitute a stack wherein, between the two DC voltage terminal elements 50, 52, and represented in FIG. 6 only, an insulating device 54 is arranged. The first DC voltage terminal element 50 lies on a support surface 240 of an only partially represented housing 20 of the current converter module 2. In this configuration, said housing 20 is configured as a sub-housing only, and thus does not entirely enclose the switching device 4, as would be possible and also customary.

In this case, the housing 20 of the current converter module 2 is configured from a high temperature-resistant plastic, in this case a polyphenylene sulfide, which additionally has a high bending strength. The DC voltage terminal elements 50, 52 are configured as thin metal plates, more specifically in this case copper plates or surface-coated copper plates, with a thickness of 700 µm. This insulating device 54 between the DC voltage terminal elements 50, 52 is configured from a plastic having a high dielectric withstand, in this case from an ethylene-tetrafluoroethylene copolymer, or from a liquid crystal polymer, with a thickness of 100 µm.

FIG. 1 shows a section of the first power electronics assembly 1 in a sectional view, wherein the section runs through a plane in which the first clamping device 7 is also located. Additionally to the above-mentioned characteristics, in this case, the first clamping device 7 and the DC voltage connecting elements 60, 62 are represented in an exploded view, whereas FIG. 2 shows the first power electronics assembly 1 in an assembled state.

In the region of the connection between the DC voltage terminal elements 50, 52 and the DC voltage connecting elements 60, 62, as described, the first DC voltage terminal element 50 lies on a support surface 240 of the housing 20, and incorporates a recess 500.

The second DC voltage terminal element 52 is set back in relation to the first, as a result of which the contact region thereof with the second DC voltage connecting element 62, viewed laterally and originating from the substrate, falls short of the recess 500.

The respective contact regions of the DC voltage terminal elements 50, 52 lie on the respective side which is averted from the cooling device 3, whereas the respective contact regions of the DC voltage connecting elements 60, 62 each lie on the respective side which faces the cooling device 3. Naturally, in the context of an alternative configuration, this entire arrangement can also be configured in mirror image.

The housing 20, in the region of its first support surface 240, incorporates a first recess 204, aligned in the z-direction with the recess 500 of the first DC voltage terminal element 50. In this, and in the further recesses 500, 620 which are aligned herewith, including that of an AC voltage connecting element 62, an insulating bush 74 is arranged, the function of which is the electrical insulation, including any requisite clearances and creepage distances, of the respective potentials. In this bush 74, a bolt 70 is arranged which, in combination with a spring device 72, configured here as disc spring, constitutes the electrically-conductive clamping connection between the first DC voltage terminal element 50 and the first DC voltage connecting element 60, and simultaneously between the second DC voltage terminal element 52 and the second DC voltage connecting element 62. To this end, the bolt 70 is screwed into an internally-threaded blind hole 32 in the cooling device 3, by means of which the first clamping device 7 is anchored in the cooling device.

In this case, the above-mentioned components constitute the first clamping device 7 of the assembly. This configuration has multiple advantages. Firstly, the arrangement of the DC voltage connecting elements 60, 62 in relation to the DC voltage terminal elements 50, 52, with respect to production techniques, is particularly simple, as the stacked DC voltage connecting elements 60, 62 simply need to be arranged on the likewise stacked DC voltage terminal elements 50, 52, and electrical connections with the correct polarity are configured by means of a single screw connection. A second significant advantage here is the attachment to the cooling device 3, which provides outstanding relief of the tensile loading of the DC voltage connecting elements 60, 62. In other words, by this configuration, any potential action of forces on the substrate 40, 42 is prevented. Moreover, the electrically-conductive connection thus configured has a particularly low inductance.

Figure 3:
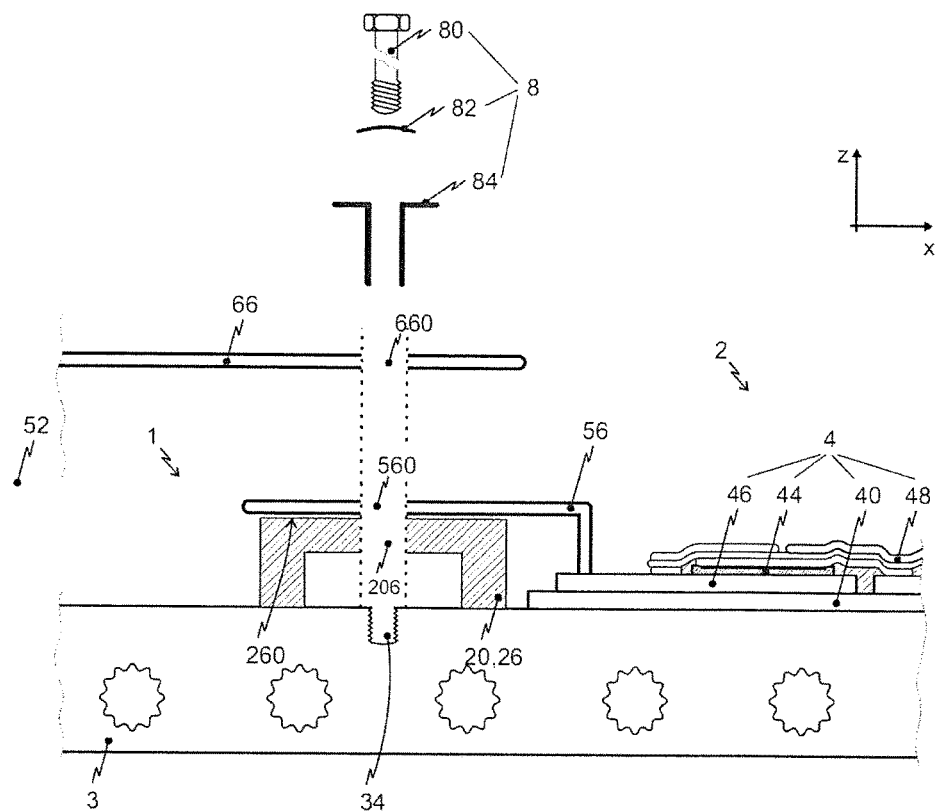
Figure 4:
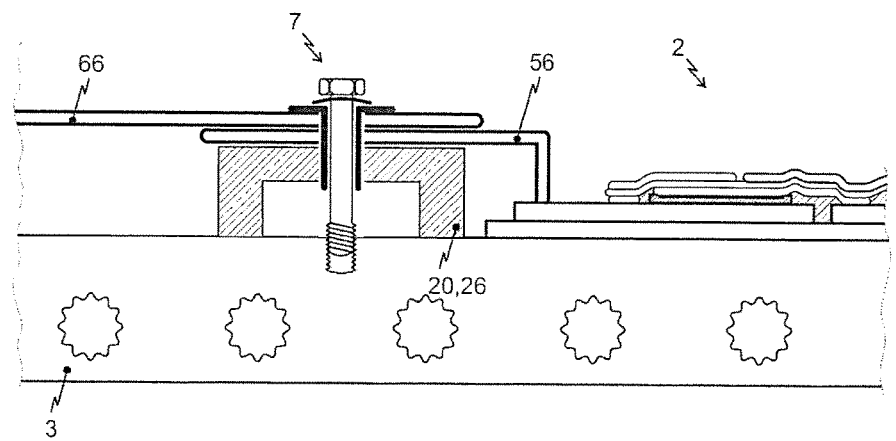

For the purposes of further external connection, the power converter module 2, as represented in FIGS. 3 and 4, incorporates an AC voltage terminal element 56, which is connected to an AC voltage potential-carrying AC voltage printed conductor 46 in an electrically conductive manner. This connection is customarily configured, in this case, without loss of generality, as a welded connection.

The function of this AC voltage terminal element 56 is the provision of a connection to an associated AC voltage connecting element 66, which is preferably connected to an electrical machine. The AC voltage terminal element 56 is configured as a thin metal plate, more specifically in this case a copper plate or surface-coated copper plate, with a thickness of 700 μm.

FIG. 3 shows a section of the first power electronics assembly 1 in a sectional view, wherein the section runs through a plane in which the second clamping device 8 is also located. Additionally to the above-mentioned characteristics, in this case, the second clamping device 8 and the AC voltage connecting element 66 are represented in an exploded view, whereas FIG. 4 shows the first power electronics assembly 1 in an assembled state.

In the region of the connection between the AC voltage terminal elements 56 and the AC voltage connecting element 66, the AC voltage terminal element 56 lies on a support surface 260 of the housing 20, and incorporates a recess 560.

In this case, the contact region of the AC voltage terminal element 56 lies on the side which is averted from the cooling device 3 (cf. FIG. 6), whereas the contact region of the AC voltage connecting element 66 lies on the side which faces the cooling device 3. Naturally, in the context of an alternative configuration, this entire arrangement can also be configured in mirror image.

The housing 20, in the region of its second support surface 260, incorporates a second recess 206, aligned with the recess 560 of the AC voltage terminal element which is aligned in the z-direction. In all the recesses 206, 560, 660 which are aligned herewith, including that of the AC voltage connecting element 66, an insulating bush 84 is arranged. In this bush 84, a bolt 80 is arranged which, in combination with a spring device 82, configured here as disc spring, constitutes the electrically-conductive clamping connection between the AC voltage terminal element 56 and the AC voltage connecting element 66. To this end, the bolt 80 is screwed simply into an internally-threaded blind hole 34 in the cooling device 3, by means of which the second clamping device 8 is anchored in the cooling device.

In this case, the above-mentioned components constitute the second clamping device 8 of the assembly. This configuration essentially features the above-mentioned advantages.

Figure 5:
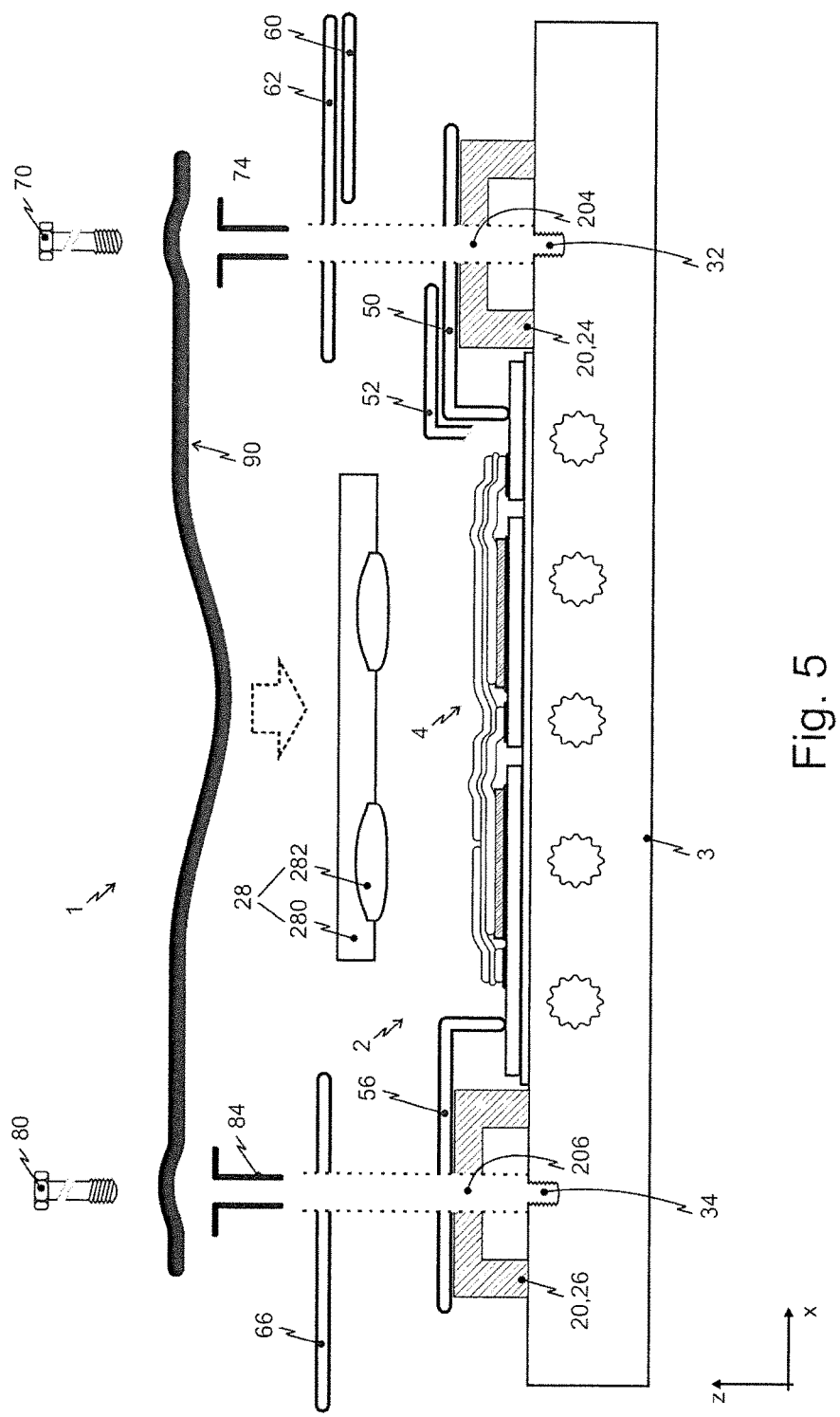
FIG. 5 shows a second configuration of an assembly according to the invention, having a second configuration of the power electronics submodule according to the invention, represented in a lateral sectional view.

FIG. 5 shows a second configuration of an assembly 1 according to the invention, having a second configuration of the power electronics submodule 2 according to the invention, in a lateral sectional view. This configuration is essentially identical to that described with reference to FIGS. 1 to 4, but additionally incorporates an essentially customary pressure device 28, comprised of a rigid pressure component 280 and elastic pressure elements 282, which project in the direction of the switching device 4.

Indirectly, via the connecting device 48, the pressure elements 282 apply pressure to the power semiconductor components 44. The primary function of this pressure device 28 is the thermal connection of the switching device 4 to the cooling device 3.

For the introduction of the force required for this purpose, a pressure loading device 90 is configured, which is designed to apply pressure to the side of the pressure device 28 which is averted from the switching device 4, preferably centrally to said pressure device 28. To this end, the pressure loading device 90 is fixed or anchored by the two clamping devices 7, 8, wherein the cooling device 3 functions as a counter-bearing. Here, the clamping device is additionally configured to execute the spring action of the disc springs 72, 82 represented in FIGS. 1 to 4.

The first and second clamping devices 7, 8 thus not only constitute the electrically-conductive connection between the terminal elements 50, 52, 54 and the connecting elements 60, 62, 64, but simultaneously constitute an outstanding thermally-conductive connection between the submodule 2 and the cooling device 3.

FIG. 6 shows a three-dimensional representation of a power electronics submodule 2. Essentially, this configuration of the submodule 2 is similar to that represented in FIG. 5, but is represented in a more structurally accurate manner, in comparison with FIG. 5, which outlines the design in a more abstract manner. A housing 20 of the power converter module 2 is represented, which encloses the switching device 4, but does not cover the latter. The switching device 4 is essentially covered by a pressure device 28, which compresses the substrate 40, 42 onto an unrepresented cooling device 3, thus forming a thermally-conductive connection with the latter. In this case, for the introduction of pressure, an alternative pressure loading device 92 is provided. This incorporates a customary central bolt, which is screwed to the cooling device and applies pressure to the pressure device via a disc spring.

The housing 20 incorporates a first coupling device 24 having a first support surface 240, upon which the first DC voltage terminal element 50 is arranged in a terminal section. Here, the contact surface of said first DC voltage terminal element 50 with a first DC voltage connecting element, as represented in FIG. 5, is represented by cross-hatching. The first DC voltage terminal element 50 further incorporates a recess 500. The housing 20 incorporates a first recess 204 which is aligned with said recess 500. Both recesses are designed to accommodate a first clamping device in the form of an insulating bush, having a bolt which passes through the latter.

Directly on the first DC voltage terminal element 50, and constituting a stack with the latter above the first support surface 240, an insulating device 54 and a second DC voltage terminal element 52 are arranged. This second DC voltage terminal element 52 in turn has a contact surface, represented by cross-hatching, with a second DC voltage connecting element. The terminal section of the insulating device 54 is set back in relation to the terminal section of the first DC voltage terminal element 50, in the direction of the substrate. Moreover, the terminal section of the second DC voltage terminal element 52 is set back in the same direction in relation to that of the insulating device 54.

The housing 20 incorporates a second coupling device 26 having a second support surface 260, upon which the AC voltage terminal element 56 is arranged in a terminal section. Here, the contact surface of said AC voltage terminal element 56 with a first AC voltage connecting element, as represented in FIG. 5, is represented by cross-hatching. The AC voltage terminal element 56 further incorporates a recess 560. The housing 20 incorporates a recess 206, as represented in FIG. 5, which is aligned with said recess 560. Both recesses are designed to accommodate a second clamping device in the form of an insulating bush, having a bolt which passes through the latter.

Figure 7:
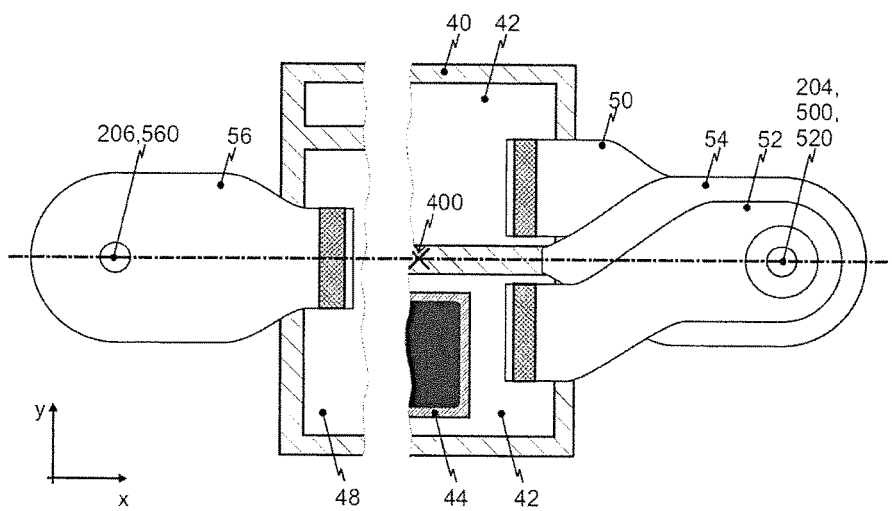
FIG. 7 shows an overhead view of a power electronics submodule.

FIG. 7 shows an overhead view of a power electronics submodule 2, represented without a housing, and essentially having the same components as described with reference to FIG. 6. In this case, it is explicitly represented that the first recess 204 of the first support element 24 and the recess 500 of the first DC voltage terminal element 50 which is aligned therewith, and furthermore the recess 520 of the second DC voltage terminal element 52, the geometrical mid-point 400 of the switching device 4, the second recess 206 of the second support element 26 and the recess 560 of the AC voltage terminal element 56 which is aligned therewith, are arranged on a dash-dotted line. It is additionally advantageous if the pressure loading device 90, in accordance with FIG. 5, exerts pressure on the pressure device in a normal direction, i.e. perpendicularly to the substrate 40, 42, and thus in alignment with the geometrical mid-point 400.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronics submodule, comprising:
   a switching device having a substrate, and incorporating a first and a second DC voltage printed conductor, to which respectively a first and a second DC voltage terminal element are connected, with a correct polarity, in an electrically conductive manner;
   an AC voltage printed conductor, to which an AC voltage terminal element is connected, with a correct polarity, in an electrically conductive manner, and having an insulating moulding which encloses the switching device in a frame-type arrangement;
   wherein the first DC voltage terminal element, by means of a first contact section, engages with a first supporting body of the insulating moulding;
   wherein the AC voltage terminal element, by means of a second contact section, engages with a second supporting body of the insulating moulding;
   wherein a first clamping device is configured to project through a first recess in the first supporting body, in an electrically insulating manner, and forms an electrically-conductive clamping connection between the first DC voltage terminal element and an associated first DC voltage connecting element; and
   wherein a second clamping device is configured to project through a second recess in the second supporting body, in an electrically insulating manner, and forms an electrically-conductive clamping connection between the AC voltage terminal element and an associated AC voltage connecting element.

2. The power electronics submodule, according to claim 1, wherein:
   the first and second DC voltage terminal elements constitute a stack with an interposed insulating device.

3. The power electronics submodule, according to claim 2, wherein:
   the insulating device is configured from a material selected from a group of materials plastics having a high dielectric withstand consisting of, polyimide, an ethylene-tetrafluoroethylene copolymer, and a liquid crystal polymer; and
   wherein said material has a thickness of 50 µm to 500 µm.

4. The power electronics submodule, according to claim 2, wherein:
   the respective first and second clamping devices are each respectively configured with a clamping element.

5. The power electronics submodule, according to clam 4, wherein:
   the respective clamping devices each incorporate an insulating bush, through which the clamping element is routed.

6. The power electronics submodule, according to claim 2, wherein:
   the housing is constituted from a material selected from a group of high temperature-resistant plastics, consisting of polyphenylene sulfide and polybutylene terephthalate.

7. The power electronics submodule, according to claim 2, wherein:
   the DC voltage terminal elements and the AC voltage terminal element are each configured as at least one of a metal foil and a metal plate; and
   said at least one has a thickness of 300 µm to 2,040 µm, wherein a thickness of 500 µm to 1,500 µm is specifically preferred.

8. The power electronics submodule, according to claim 2, wherein:
   the first recess in the first supporting body, a geometrical midpoint of the switching device, and the second recess in the second supporting body are arranged in a single line.

9. The power electronics submodule, according to claim 3, wherein:
   said material has a thickness of 75 µm to 150 µm.

10. The power electronics submodule, according to claim 4, wherein:
    said clamping element is at least one of a through-bolt and a spring device.

11. The power electronics submodule, according to claim 7, wherein:
    said at least one has a thickness of thickness of 500 µm to 1,500 µm.

12. An assembly having a power electronics submodule according to claim 1, comprising:
    a support device; and
    wherein the respective clamping device, specifically a respective bolt, is anchored in the support device by screwing and, simultaneously, by means of the first clamping device, an electrically-conductive clamping connection is formed between the first DC voltage terminal element and an associated first DC voltage connecting element, and by means of the second clamping device, an electrically-conductive clamping connection is formed between the AC voltage terminal element and an associated AC voltage connecting element.

13. The assembly, according to claim 9, wherein:
    simultaneously, by means of the first clamping device, an electrically-conductive clamping connection is formed between the second DC voltage terminal element and an associated second DC voltage connecting element.

14. The assembly, according to claim 12, wherein:
the support device is configured as a cooling device.

15. The assembly, according to claim 12, further comprising:
- a pressure device arranged above the switching device, which compresses the switching device onto the support device; and
- wherein a pressure loading device is arranged above the pressure device, which is attached by means of the first and the second clamping devices, such a pressure is transmitted to the pressure device.

16. An arrangement, according to claim 12, wherein:
a plurality of submodules, having a common overall housing, constitute a power module.

* * * * *